US012655015B2

(12) United States Patent (10) Patent No.: US 12,655,015 B2
Kaiser et al. (45) Date of Patent: Jun. 16, 2026

(54) MICROELECTROMECHANICAL DRIVE FOR MOVING OBJECTS

(71) Applicant: Fraunhofer-Gesellschaft zur Foerderung der angewandten Forschung e.V., Munich (DE)

(72) Inventors: Bert Kaiser, Dresden (DE); Holger Conrad, Dresden (DE); Shashank Shashank, Dresden (DE); Keyvan Narimani, Dresden (DE); Matthieu Gaudet, Dresden (DE); Sergiu Langa, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 700 days.

(21) Appl. No.: 17/816,050

(22) Filed: Jul. 29, 2022

(65) Prior Publication Data

US 2022/0380201 A1 Dec. 1, 2022

Related U.S. Application Data

(63) Continuation of application No. PCT/EP2021/051652, filed on Jan. 26, 2021.

(30) Foreign Application Priority Data

Jan. 31, 2020 (DE) .......................... 102020201241.5

(51) Int. Cl.
 *B81B 3/00* (2006.01)
 *B81B 5/00* (2006.01)
(52) U.S. Cl.
 CPC .............. *B81B 3/0051* (2013.01); *B81B 5/00* (2013.01); *B81B 2201/034* (2013.01); *B81B 2203/0118* (2013.01)

(58) Field of Classification Search
 CPC ... B81B 3/0051; B81B 5/00; B81B 2201/034; B81B 2203/0118; B81B 2201/038;
 (Continued)

(56) References Cited

U.S. PATENT DOCUMENTS 5,049,775 A 9/1991 Smits
5,870,007 A * 2/1999 Carr ...................... F03G 7/0613
 333/197

(Continued)

FOREIGN PATENT DOCUMENTS

CN 103943420 B * 6/2017
DE 102014225934 A1 6/2016
 (Continued)

OTHER PUBLICATIONS

Conrad, Holger, et al., "A small-gap electrostatic micro-actuator for large deflections", Nature Communications, vol. 6, No. 1, Dec. 1, 2015 (Dec. 1, 2015), XP055798838, 7 pp.
 (Continued)

*Primary Examiner* — Chad M Dicke
*Assistant Examiner* — Gary Abel
(74) *Attorney, Agent, or Firm* — Perkins Coie LLP; Michael A. Glenn

(57) ABSTRACT

The invention relates to a microelectromechanical drive for moving an object, having electrostatic bending actuators, wherein each electrostatic bending actuator has a cantilever having at least one active element which has a layer stack forming at least one capacitor positioned offset to a center-of-gravity-plane of the cantilever which leads alongside a longitudinal axis of the cantilever from a supported end of the cantilever to a loose end, which is averted from the supported end of the cantilever and which has a contact area for engaging with the object.

The microelectromechanical drive can be used to displace any target objects from nanoscopic to macroscopic sizes that (Continued)

are within the force-displacement configurations of the electrostatic bending actuators. The microelectromechanical drive is suited to act as an inchworm drive.

23 Claims, 7 Drawing Sheets

(58) Field of Classification Search
CPC .... B81B 3/0002; B81B 3/0005; H02N 1/006; H01H 3/60
See application file for complete search history.

(56) References Cited

U.S. PATENT DOCUMENTS

| | | | |
|---|---|---|---|
| 6,437,485 B1 | 8/2002 | Johansson | |
| 10,194,788 B2 * | 2/2019 | Vance | A61B 1/00096 |
| 10,885,422 B2 | 1/2021 | Spieth | |
| 2003/0168928 A1 * | 9/2003 | Clark | H02N 1/006 |
| | | | 310/309 |
| 2005/0285479 A1 | 12/2005 | Machida | |
| 2007/0069604 A1 | 3/2007 | Bourbon et al. | |
| 2007/0165444 A1 * | 7/2007 | Culver | G11B 5/127 |
| 2009/0251027 A1 * | 10/2009 | Kudoh | F03G 7/005 |
| | | | 29/25.35 |
| 2014/0374856 A1 * | 12/2014 | Chen | B81B 3/0005 |
| | | | 257/637 |
| 2015/0162853 A1 * | 6/2015 | Leroy | H10N 30/202 |
| | | | 310/323.02 |
| 2016/0023244 A1 * | 1/2016 | Zhuang | B81B 3/0037 |
| | | | 29/829 |
| 2016/0173001 A1 * | 6/2016 | Langa | B81B 3/0021 |
| | | | 438/22 |
| 2018/0179048 A1 * | 6/2018 | Schenk | B81C 1/00158 |
| 2019/0312528 A1 * | 10/2019 | Schaler | H02N 1/002 |
| 2020/0087138 A1 | 3/2020 | Schenk et al. | |
| 2021/0005947 A1 * | 1/2021 | Kishk | H01P 5/12 |
| 2022/0002143 A1 | 1/2022 | Langa et al. | |

FOREIGN PATENT DOCUMENTS

| | | |
|---|---|---|
| DE | 102016220111 B3 | 2/2018 |
| DE | 102017206766 A1 | 10/2018 |
| DE | 102019203914 B3 | 7/2020 |
| JP | H02142365 A | 5/1990 |
| JP | H07177773 A | 7/1995 |
| JP | 2000253683 A | 9/2000 |
| WO | 2012095185 A1 | 7/2012 |

OTHER PUBLICATIONS

Gao, Yunye, et al., "A self-adapting linear inchworm piezoelectric actuator based on a permanent magnets clamping structure", Mechanical Systems and Signal Processing 132 (2019), XP085774167., pp. 429-440.

Penskiy, I, et al., "Optimized electrostatic inchworm motors using a flexible driving arm", J. Micromech. Microeng. 23 (2013) 15018., 13 pp.

Wang, Weisong, et al., "Precision in-package positioning with a thermal inchworm", Sensors and Actuators A: Physical 142 (2008), XP022455427., pp. 316-321.

Wickramasinghe, I.P.M., et al., "Lateral stability of a periodically forced electrostatic comb drive", 2012 American Control Conference (Acc), IEEE, Jun. 27, 2012-Jun. 29, 2012., pp. 80-85.

Zhou, H W, et al., "Microstructure of thick polycrystalline silicon films for MEMS application", Sensors and Actuators A: Physical 104 (2003), XP004410578., 2003, pp. 1-5.

* cited by examiner

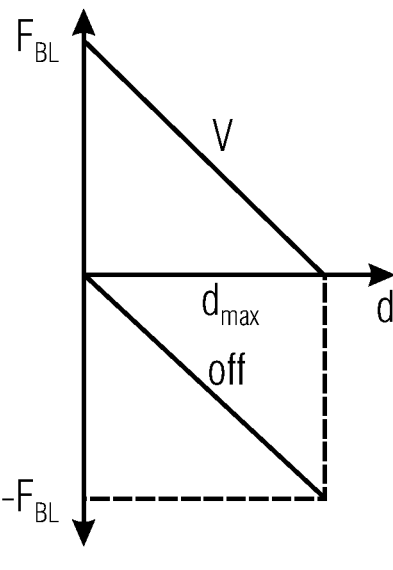
Fig. 5
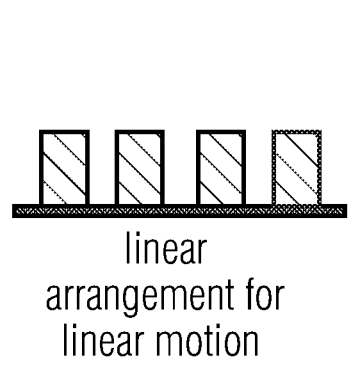
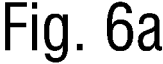
linear
arrangement for
linear motion
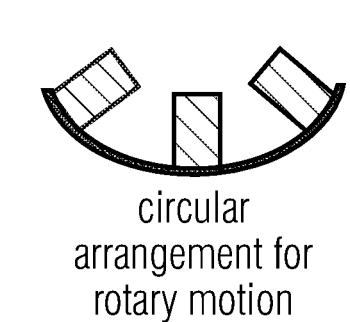
circular
arrangement for
rotary motion
Fig. 6a                                    Fig. 6b threads, allow screw-like or plane rotation side view top view side view top view Top view and side view of an example cylindrical target body, allowing rotary out-of-plane motion.

An example circular target body, allowing rotary in-plane motion.

electrostatic bending actuator 10 und spring 9 side view top view

Top and side view of an example target body 20,
allowing linear 0°, 45° and 90° in-plane motion.
Side view shows that each edge is separated in z-direction,
allowing decoupling of the motion.

MICROELECTROMECHANICAL DRIVE FOR MOVING OBJECTS

CROSS-REFERENCE TO RELATED APPLICATIONS

This application is a continuation of copending International Application No. PCT/EP2021/051652, filed Jan. 26, 2021, which is incorporated herein by reference in its entirety, and additionally claims priority from German Application No. 102020201241.5, filed Jan. 31, 2020, which is also incorporated herein by reference in its entirety.

TECHNICAL FIELD

Embodiments of the present invention relate to a microelectromechanical drive for moving an object.

BACKGROUND OF THE INVENTION

Microelectromechanical drives, e.g. inchworm micro electro mechanical systems (MEMS) for moving an object have been developed for some time. This disclosure deals with an inchworm micro electro mechanical system (MEMS), which relates to Piezoelectric, thermal, electrostatic etc. as active element. The invention relates, in particular, to a nanoscopic electrostatic drive (NED) cell described in [1] as active element. Inchworm drives are already known as a positioning approach, using piezoelectric [2], thermal [3] or electrostatic elements [4]. Electrostatic inchworm drives based on surface micro-machining, which employ polysilicon, have typically a thickness limited to 2-5 µm due to deposition limitation and grain boundary effect [5]. Electrostatic based inchworm drives, have a certain limitation of scaling factor, due to stability of the system based on technological aspects [6].

For example, the two main variants of electrostatic actuators, namely comb drive and direct electrostatic gap actuation, suffer from pull-in instability by increasing the length or number of fingers due to technological variations. Patent US 2007/0069604 A1 presents an inchworm actuator based on electrostatic comb drives as active elements and uses mechanical clamping. In an embodiment, it shows a circular wheel rotated by three active elements forming an angle of 120 degrees. Moreover, each active element comprises two comb drives, one for mechanical clamping and one for pushing the target body, thus limiting the number of active elements, which may be brought around the circular wheel.

Patent JP 2000 253683 A utilizes an inchworm drive with electrostatic clamping.

It is an object of the present invention to provide a miniaturized microelectromechanical drive for moving an object fast, precisely and in an efficient way.

SUMMARY

An embodiment may have a microelectromechanical drive for moving an object, comprising electrostatic bending actuators, wherein each electrostatic bending actuator comprises a cantilever comprising at least one active element which comprises a layer stack forming at least one capacitor positioned offset to a center-of-gravity-plane of the cantilever which leads alongside a longitudinal axis of the cantilever from a supported end of the cantilever to a loose end, which is averted from the supported end of the cantilever and which comprises a contact area for engaging with the object.

The microelectromechanical drive for moving the object, comprises electrostatic bending actuators, wherein each electrostatic bending actuator comprises a cantilever comprising at least one active element which comprises a layer stack forming at least one capacitor positioned offset to a center-of-gravity-plane of the cantilever, which leads alongside a longitudinal axis of the cantilever from a supported end of the cantilever to a loose end of the cantilever, which is averted from/to the supported end of the cantilever. In other words, the loose end on the averted side of the supported end of the cantilever which comprises a contact area for engaging with the object. This kind of microelectromechanical drive allows for large deflections per actuation resulting in a more efficient movement of the target object.

In the context of the invention, the microelectromechanical drive can be understood as an electrostatic bending actuator, a so-called Nanoscopic-Electrostatic-Drive (NED) as described, e.g. Conrad et al (NED). According thereto, a cantilever is the actuated element on top of which the layer stack is added, wherein the layer stack forming at least one capacitor positioned offset to the center-of-gravity-plane is composed of a bottom electrode connected to the cantilever and a top electrode spaced by electrical isolation islands from the bottom electrode forming gaps between the electrically conductive electrodes. The isolation islands are distributed at a certain pitch along the two electrodes and have two main tasks: to isolate electrically the bottom and the top electrode from each other and to transmit the mechanical forces from the top electrode to the underlying layers. By applying a voltage between the top and bottom electrodes, electrostatic attraction forces between the electrodes will be generated whereby pulling the top electrode towards the bottom electrode, thus introducing a mechanical strain in the top electrode. The top electrode transmit this strain to the structures underneath in the form of lateral acting mechanical forces which will consequently deform the whole actuator, i.e., the electrostatic bending actuator, which will lead to the bending of the associated section of the cantilever. Thus, the actuation principle relies on effective conversion of the electrostatic forces into lateral mechanical forces.

The microelectromechanical drive presented in this invention can be designed to position objects in the plane of the microelectromechanical drive, out-of-plane, and/or a combination of both. The drive presented can generate linear motions, rotatory motions and/or multidirectional motions independently or simultaneously based on the design and driving mechanism. The microelectromechanical drive describes a system of active elements and a target body in which the microelectromechanical drive(/s) periodically clamp on and release the target body and by timely deflection, translate the target body in an intended fashion. The microelectromechanical drive can be utilized to position and move objects in precise measurement and observation equipment, or manipulate objects in microsurgery appliances, assembly instruments or laboratory machines, microsystem assemblies, micro-optical benches, etc. Compared to a piezoelectric or thermal inchworm drive, the NED microelectromechanical drive according to the invention has the advantage of consuming less power, which makes it suitable for low-power applications, for example, in mobile devices. Furthermore, the operation frequency of a NED based microelectromechanical drive is higher than a thermal based inchworm drive. Moreover, compared to a piezoelectric inchworm drive, the NED microelectromechanical drive occupies less area and in most of the cases is CMOS compatible.

According to one embodiment of the microelectromechanical drive, the layer stack forms a first capacitor positioned offset to the center-of-gravity-plane of the cantilever, and a second capacitor positioned offset to the center-of-gravity-plane, so that the center-of-gravity-plane is arranged between the first and second capacitors. A configuration according to this embodiment allows for a faster, stronger, and even larger deflection of the cantilever compared to the aforementioned embodiment of the microelectromechanical drive, specifically if thereto capacitors are facing each other in the common parallel plane of projection. Above that, two capacitors allow operation of the microelectromechanical drive also in case of failure of one of the two capacitors ensuring that the target object is moved anyway.

In another embodiment, the microelectromechanical drive of each actuator comprises a cantilever comprising at least one first active element, which comprises a first layer stack forming a first capacitor positioned offset to a center-of-gravity-plane of the cantilever which leads alongside a longitudinal axis of the cantilever from a supported end of the cantilever to an averted end [of the supported end] of the cantilever which comprises a contact area for engaging with the object, and a second capacitor positioned offset to the center-of-gravity-plane so that the center-of-gravity-plane is arranged between the first and second capacitors, and at least one second active element which comprises a second layer stack forming a third capacitor positioned offset to the center-of-gravity-plane and a fourth capacitor positioned offset to the center-of-gravity-plane so that the center-of-gravity-plane is arranged between the first and third on the one hand and the second and fourth capacitors on the other hand, wherein the at least one first and the at least one second elements are mutually offset along the longitudinal axis so the at least one first and the at least one second elements are bending conversely so that the cantilever is bend towards opposite sides of the center-of-gravity-plane within the at least one first element on the one hand and the at least one second element on the other hand. This embodiment of the microelectromechanical drive allows the cantilever to perform movements corresponding to a conventional inchworm drive.

The active elements of such an inchworm drive, i.e. microelectromechanical drive are generating force and stroke to move the target object. In this configuration, the first active element is, e.g., bend upwards while the second active element is bend downwards, i.e., in an opposite way. This configuration results in a linear motion of the loose end of the cantilever of the microelectromechanical drive. The number of active elements and the length of the cantilever affect the max stroke and blocking force as well as resonant frequency of the cantilever, i.e., the microelectromechanical drive. The blocking force has an inverse relation to the length of the cantilever ($\propto 1/L$), whereas the maximum stroke has direct relation with the length ($\propto L^2$) and the resonant frequency of the cantilever is proportional to $\sqrt{(1/L^3)}$, whereby L being the length of the cantilever.

According to an embodiment, all active elements of the microelectromechanical drive, i.e., the first active element and the second active element—extending along a common longitudinal axis—of the cantilever are bendable in a common plane. This configuration ensures a linear motion of the loose end, i.e., tip of the cantilever. Moreover, the microelectromechanical drive provides the possibility of independent stacking the active elements, thus allowing a large degree of freedom in scaling the force and displacement entailed. The advantage of this kind of stacking approach is that it allows for transmitting large forces to the target body in a very efficient way. Further, for increasing the flexibility in use at least two electrostatic bending actuators of the microelectromechanical drive are arranged in/at a predetermined angle to each other.

Microelectromechanical drive according to one of the preceding claims, wherein the electrostatic bending actuators are grouped into at least two electrostatic bending actuators and the microelectromechanical drive is configured so that the electrostatic bending actuators within one group are actuated so as to perform a simultaneous back and forth bending, and/or electrostatic bending actuators of different groups are actuated in a phase offset manner.

According to an embodiment, all cantilevers of all electrostatic bending actuators are configured to bend in a common plane. In other words the electrostatic bending actuators can be arranged such, that they allow for a comb-configuration of the microelectromechanical drive. In this configuration the microelectromechanical drive can transmit large forces to a body of a target object in the very efficient manner, allowing to move therefore heavier and/or bigger bodies of the target object, e.g., when all the cantilevers of the comb-configuration are actuated simultaneously.

In another embodiment of the microelectromechanical drive, the cantilevers of all electrostatic bending actuators are arranged parallel to each other so that the contact areas of the cantilevers are arranged so as to form a transport surface of the object. In order to increase the effectiveness and efficiency of the microelectromechanical drive moving/transporting a specific target object, the form and/or dimensions of the cantilevers of the microelectromechanical drive can be adjusted—in order to correspond to a surface of the target object.

According to another embodiment, the longitudinal extension of the two adjacent active elements is equal. This configuration allows a distortion of the cantilever in a S-shape ensuring again a linear motion of the loose and, i.e., tip or contact area at the averted of the supported end of the cantilever.

The microelectromechanical drive according to a further embodiment is realized as an inchworm drive. Due to the high degree of freedom of the microelectromechanical drive and the possibility to control the microelectromechanical drive to perform stepping actions, the microelectromechanical drive is predestined to be used in the form of an inchworm drive allowing for high flexibility in use.

Since the cantilever of the electrostatic bending actuator(s) of the microelectromechanical drive can be manufactured in a length between 2 micrometers up to 280 millimeters a high miniaturization degree, i.e., a high scale of miniaturization can be reached. The advantageous lengths of electrostatic bending actuators for use according to embodiments of the invention are lengths between 10 micrometer and 10 millimeters. To enable both, good power transmission/transfer and the appropriate distance of movement of the loose end and contact area respectively of the cantilever, an advantageous length of an electrostatic bending actuator is around 600 µm.

According to an embodiment, the cantilever of the electrostatic bending actuator of the microelectromechanical drive can be moved/actuated in a frequency range between 5 kHz up to 100 MHz and more advantageously, in a frequency around 10 kHz. Depending on a movement velocity and/or a surface of the target object, the microelectromechanical drive frequency of movement/actuation can be controlled exactly and easily in order to allow a secure contact between the contact area of the microelectromechanical drive, i.e., the contact area at the loose end of the cantilever without damaging neither the contact area of the microelectromechanical drive nor the contract area/surface of the target object, allowing the best possible force transfer from the microelectromechanical drive to the target object to be moved.

According to an embodiment, the electrostatic bending actuator(s) of the microelectromechanical drive is made of one or more material selected from crystalline-silicone, TiAl, SiO2, Al2O3. According to this embodiment, the NED-based microelectromechanical drive, e.g., an inchworm drive, utilizes crystalline silicon as a structural material in a standard case, thus enabling to achieve much larger thicknesses, greatly enhancing the force-displacement characteristics. In the cases of NED microelectromechanical drive utilizing crystalline silicon, the lifetime of the device is also increased compared to other cases, such as a poly-silicon based inchworm drive, due to single crystallinity of the structural material. Moreover, compared to a piezoelectric inchworm drive, a NED microelectromechanical drive occupies less area and in most of the cases, is CMOS compatible that allow direct integration of control circuitry and metallization in the fabrication process, therefore allowing miniaturization of highly complex structures.

According to another embodiment, the supported end of the cantilever of the microelectromechanical drive is supported in a fixed mount/clamped bearing. Due to the fixed support of the cantilever, the microelectromechanical drive can only be bent in a certain direction and upon relief, it can be bent back in the initial position, that is entailed for/in some specific use cases or applications.

To allow movement of an electrostatic bending actuator of the microelectromechanical drive, the supported end of the cantilever is held in a guided bearing, which allows for displacement in direction of a longitudinal extension of the cantilever. Hence, the guided bearing allows only for translational movement of the supported end of the cantilever of the microelectromechanical drive in longitudinal direction of the cantilever, while preventing the cantilever from twisting and/or rotating in the bearing.

According to an embodiment, the supported end of the cantilever is attached to a spring—to limit the movement/displacement in direction of the longitudinal axis/extension of the cantilever.

The spring can be used on one hand to enable the cantilever of the microelectromechanical drive to clamp on the surface of the target object by using mechanical—pressure— and/or electrostatic force and on the other hand, to detach the contact area of the cantilever of the microelectromechanical drive from the surface of the target object exerting a restoring force—acting for instance, against stress caused by an electric field exerted on the loose end of the cantilever and the target object. Based on the intended application, the spring can have any suitable form such as fixed-fixed flexure, serpentine springs, etc.

According to an embodiment, the supported end of the cantilever is attached to a sliding guide—to control the movement/displacement in direction of the longitudinal axis/extension of the cantilever.

According to an embodiment, the supported end of the cantilever is attached to a horizontal support with a variable length—to control the movement/displacement in direction of the longitudinal axis/extension of the cantilever.

According to an embodiment, the spring is configured to actively and/or passively exert restoring force upon tension.

The springs can be categorized as being passive or active. In case of passive springs, they do not generate any movement by themselves and use passive elements.

On the other hand, the spring is configured, according to another embodiment, to actively and/or passively exert a clamping force by pressing the contact area of the cantilever against or in direction to the target object. An active spring can generate a force and movement along the direction of clamping, for example, by using NED beams as active elements. The former can be used in electrostatic clamping and the latter can be used in mechanical clamping. In case of a combination of clamping forces, an active spring can be used.

Furthermore, according to another embodiment, several cantilever of different electrostatic bending actuators can share one spring according to the intended application and condition. This is specifically advantageous when more than two electrostatic bending actuators are arranged comb-like.

According to an embodiment, the contact area on the loose end of the cantilever comprises an insulation layer. The clamping surface of the target object can either be metallic or have a conductive coating. The isolation layer on the surface of the contact area of the cantilever, i.e., the electrostatic bending actuator can be a dielectric material or insulating fluid depending upon the design, which enables to maintain an electrostatic force upon contact of the electrostatic bending actuator contacting area with the surface of the target object. The isolation layer prevents electrical break down during clamping and reduces the chance of electrostatic stiction.

According to an embodiment, the insulation layer of at the loose end of the cantilever of the electrostatic bending actuator is structured. The embodiment introduces an additional possibility of using mechanical locking for the insulator along with the electrostatic clamping to achieve high reliability On one hand the structured insulation layer reduces the stiction surface and on the other hand the structured insulation layer of the cantilever which is made e.g., of Si, allows for a high mechanical stability and resilience improving the reliability of the contact area of the electrostatic bending actuator.

According to another embodiment, the contact area of the microelectromechanical drive and its electrostatic bending actuator respectively comprises an anti-stiction coating. Clamping of the contact area on the surface of the movable target object seeks two purposes. Firstly, to form a reliable contact to move the target object. Secondly, to allow the electrostatic bending actuator to hold the target object in place, preventing wobbling and maintaining its position. Contact areas can be coated with anti-stiction coating, e.g., atomic layer deposited FDTS coating, to prevent unintended stiction between the contacting surfaces of the contact area of the electrostatic bending actuator and the surface of the target object.

According to an embodiment, the material of the contact area of the microelectromechanical drive comprises Al2O3, SiO2, HfO2 and the like. The material of the contact area can be grown or deposited on the surface of the contact area of the loose end of the cantilever of the microelectromechanical drive.

According to an embodiment, the contact area of the microelectromechanical drive has a predefined structure, e.g., comprising one or more protrusions complementing the structure of the surface of the target object to be moved. The contact area can be continuous or broken. It can also be patterned to allow for mechanical locking in the material of the cantilever for better stability and robustness.

According to an embodiment, the microelectromechanical drive is configured to move target objects made of solid matter. In order to provide an effective and efficient movement of target objects, the target object has a stiff and resilient surface interacting with the contact area of the microelectromechanical drive.

The microelectromechanical drive can be used to displace any objects from nanoscopic to macroscopic sizes that are within the force-displacement configurations of the electrostatic bending actuators.

BRIEF DESCRIPTION OF THE DRAWINGS

Embodiments of the present invention will be described in more detail with reference to the appended drawings, in which:

FIG. 5 shows a force-displacement-graph for an electrostatic bending actuator of a microelectromechanical drive according to an embodiment;

FIG. 6a, 6b shows different arrangements of electrostatic bending actuators of a microelectromechanical drive according to embodiments;

DETAILED DESCRIPTION OF THE INVENTION

Figure 1:
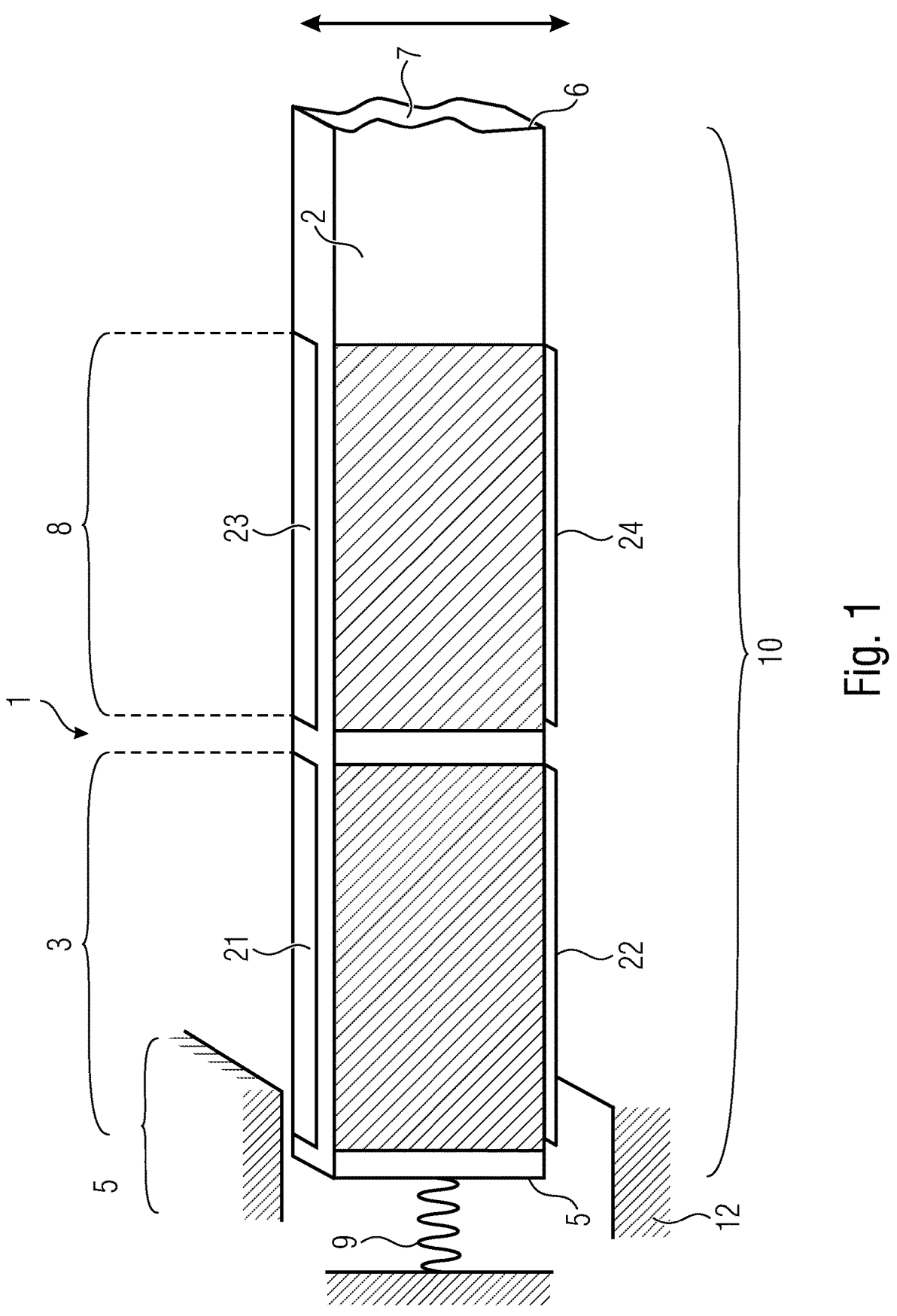
FIG. 1 shows a schematic diagram of an electrostatic bending actuator according to an embodiment.

Equal or equivalent elements or elements with equal or equivalent functionality are denoted in the following description by equal or equivalent reference numerals.

Method steps, which are depicted by means of a block diagram and which are described with reference to said schematic diagram, may also be executed in an order different from the depicted and/or described order. Furthermore, method steps concerning a particular feature of a device may be replaceable with said feature of said device, and the other way around.

FIG. 1 depicts a schematic diagram of an electrostatic bending actuator 10 according to an embodiment, which forms a basic microelectromechanical drive 1. The electrostatic bending actuator 10 is formed in a shape of a supported beam, thus, a cantilever 2. The cantilever 2 extends in longitudinal direction/extension from a supported end 5 to a loose end 6, which is averted from the supported end 5 of the cantilever 2. The loose end 5 comprises a contact area 7 for engaging with a target object 20. According to the embodiment depicted in FIG. 1, the supported end 5 of the electrostatic bending actuator 10, i.e., the cantilever 2 is held in a guided bearing 12 allowing only for movement in a direction of the longitudinal axis 4 of the cantilever 2 which is held in the guided bearing by a spring 9.

Other embodiments of the support for the supported end 5 of the cantilever 2 can comprise fixed mounts, e.g., a clamped bearing.

Other embodiments of the support for the supported end 5 of the cantilever 2 can comprise a sliding guide or a horizontal support with a variable length.

The electrostatic bending actuator 10 in the depicted embodiment comprises a first active element 3 and the second active element 8, situated adjacent to each other alongside a longitudinal axis 4 of the cantilever 2. The first active element 3 comprises a first layer stack forming a first capacitor 21 positioned offset of a center-of-gravity-plane 4 and a second capacitor 22 positioned offset to the center-of-gravity-plane 4, so that the center-of-gravity-plane 4 is arranged between the first capacitor 21 and the second capacitor 22. The second active element 8 comprises a second layer stack forming of third capacitor 23 positioned offset to the center-office-gravity-plane 4 and the fourth capacitor 24 positioned offset to the center-of-gravity-plane 4, so that the center-of-gravity-plane 4 is arranged between the first capacitor 21 and the third capacitor 23 on the one hand, and on the second capacitor 22 and the fourth capacitor 24 on the other hand, wherein the first active element 3 and second active element 8 are mutually offset along the longitudinal axis 4 of the cantilever 2. The longitudinal axis 4 as well as the position of center-of-gravity-plane 4 are indicated by a chain dotted line in FIG. 1. By applying a voltage to the capacitors 21, 22, 23, 24 of the first and second active elements 3, 8 the cantilever 2 of the electrostatic bending actuator 10 can be moved—the stroke direction is indicated by the double headed arrow in FIG. 1.

According to other embodiments, the electrostatic bending actuator 10 of a microelectromechanical drive 1 can comprise more than two active elements 3, 8 arranged along a longitudinal extension of the electrostatic bending actuator 10. According to other embodiments, a microelectromechanical drive 1 can comprise a multitude of electrostatic bending actuators 10.

The embodiment of the microelectromechanical drive 1 in FIG. 1 allows the cantilever 2 to perform movements corresponding to a conventional inchworm drive. For simplification, the principle of movement of a target object 20 is shown using a microelectromechanical drive 1 with only one electrostatic bending actuators 10.

Figure 2:
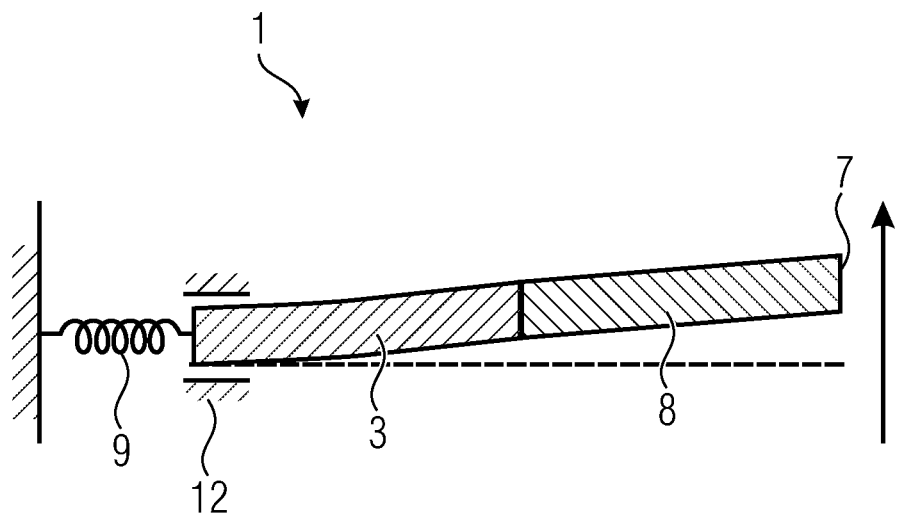
FIG. 2 shows a schematic diagram of an electrostatic bending actuator according to an embodiment of a microelectromechanical drive with two active elements in an actuated state.

FIG. 2 shows a schematic diagram of an electrostatic bending actuator 10 according to an embodiment with two active elements 3, 8—e.g., the embodiment in FIG. 1—in an actuated state—the stroke direction of the loose end 6 of the cantilever 2 is indicated by the bidirectional arrow. The microelectromechanical drive 1 according to the embodiment in FIG. 2 can be operated like an inchworm drive. Two active elements 3, 8 of the microelectromechanical drive 1 are generating force and stroke to move the target object 20. This microelectromechanical drive 1, e.g., inchworm drive, comprises two active elements 3, 8 which constitute a cantilever 2. The cantilever 2 is connected to a spring 9 on its supported end 5, wherein the supported end 5 is held in a guided bearing 12, allowing the cantilever 2 to move in a direction of its longitudinal axis 4. In this configuration, the first active element 3 bends upwards while the second active element 8 bends downwards. This configuration results in a linear motion of the loose end 6, which is located averted to the supported end 5 of the cantilever 2 to the tip/loose end of the active element 8. The number of elements and the length L of the cantilever 2 affect a max stroke and blocking force as well as resonant frequency of the beam. The blocking force has an inverse relation to the length of the beam ($\propto 1/L$), the maximum stroke has direct relation with the length ($\propto L^2$) and resonant frequency is proportional to $\sqrt{(1/L^3)}$, whereby L being the length of the cantilever 2. The loose end 6 of the cantilever 2 of the microelectromechanical drive 1 comprises a contact area 7 which contacts, i.e., clams a surface 27 of a target object 20 to be moved.

The clamping of the electrostatic bending actuator 10 on the surface/body of the movable target object 20 seeks two purposes. Firstly, to form a reliable contact to move the target object 20. Secondly, to allow the electrostatic bending actuators 10 to hold the target object 20 in place, preventing wobbling and maintaining its position. Additionally the contacting surfaces 7, 27 can be coated with anti-stiction coating, e.g., atomic layer deposited FDTS coating, to prevent unintended stiction between the contacting surfaces of the contact area 7 and the surface 27 of the target object 20. In order to clamp an electrostatic bending actuator 10 on the surface of the target object 20, different clamping approaches can be implemented.

According to an embodiment, electrostatic force can be used in order to clamp the contact area 7 of the loose end 6 of the cantilever 2 of the electrostatic bending actuator 10 to the surface 27 of the target object 20.

Figure 3:
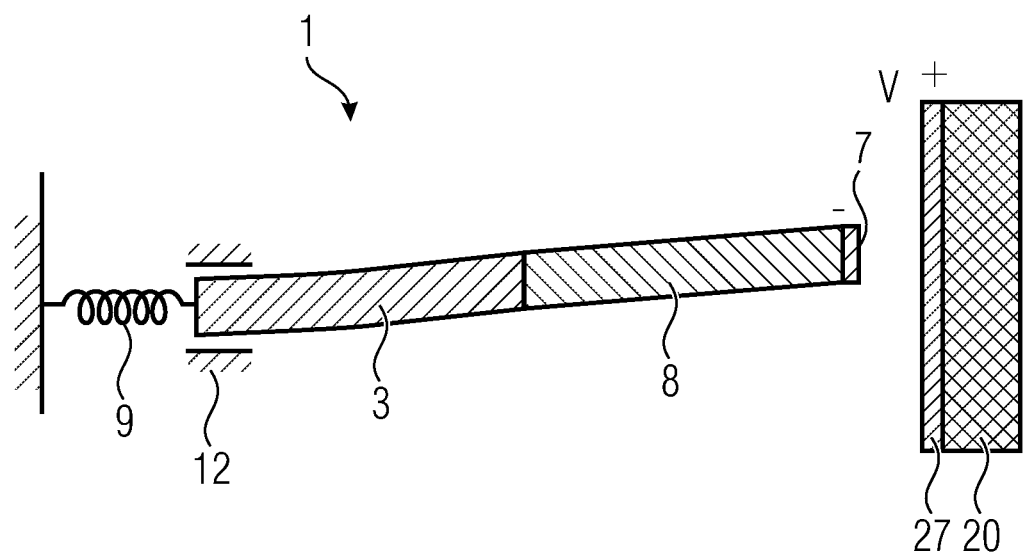
FIG. 3 shows a schematic diagram of an electrostatic bending actuator and a target object to be moved according to an embodiment of a microelectromechanical drive with two active elements in an actuated state.

FIG. 3 shows a schematic diagram of an electrostatic bending actuator 10 and a target object 20 to be moved according to an embodiment of a microelectromechanical drive 1, e.g., an inchworm drive with two active elements 3, 8 in an actuated state. By creating a voltage V difference between the contact area 7 of the loose and 6 of the cantilever 2 and the surface 27 of the clamping target, the electrostatic bending actuator 10 is attracted to the target object 20 and clamps on its surface 27. The spring 9 allows the motion of the electrostatic bending actuator 10 to achieve clamping. According to an embodiment, a magnitude of the voltage V difference depends on the employed springs, the electrical isolation layer I on the contact area 7 and/or the surface 27 and the distance between the two surfaces 7, 27. FIG. 3 depicts the different components involved in the electrostatic clamping.

Figure 8:
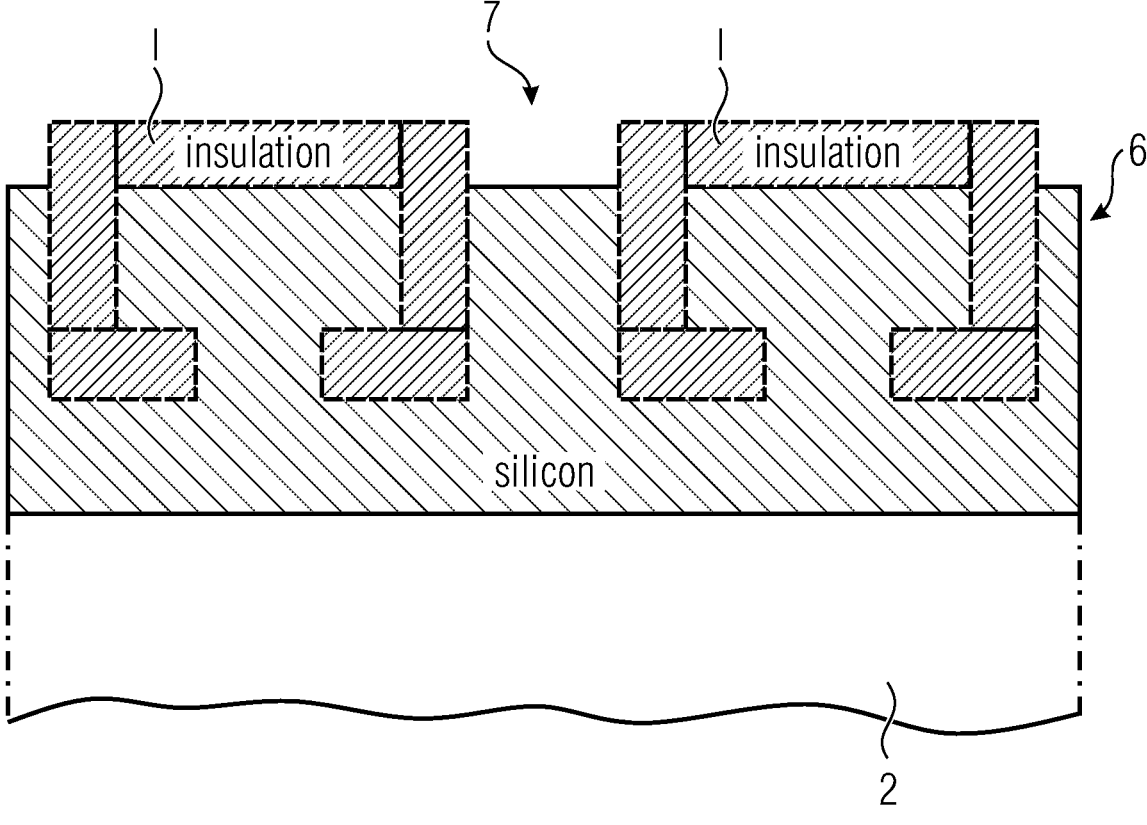
FIG. 8 shows a structure of an insulation layer at the contact area at the loose end of a cantilever of a microelectromechanical drive according to an embodiment.

The spring can be in any suitable form such as fixed-fixed flexure, serpentine springs, etc. According to another embodiment, several electrostatic bending actuators 10 can share a spring 9, depending on the intended application and design. The clamping surface 27 can either be metallic or have a conductive coating. An isolation layer I can be present on both surfaces 7, 27 or on just one of them. The isolation layer I can be a dielectric material or insulating fluid depending upon the design, which enables to maintain the electrostatic force upon contact of the electrostatic bending actuator 10 contacting part, i.e., contact area 7 with the target surface 27. The isolation layer I prevents electrical break down during clamping and reduces the chance of electrostatic stiction. It can be grown or deposited on the surface 27, some examples including Al2O2, SiO2, HfO2, etc. The isolation layer I can be continuous or broken. It can also be patterned to have mechanical locking into e.g., silicon for better stability and robustness as shown in FIG. 8. The structural material used for the cantilever 2 according to an embodiment can be crystalline silicon. Crystalline silicon is easy to process and above that CMOS-compatible.

According to another embodiment additionally, the insulation layer can be structured in certain ways as shown for example in FIG. 8 since it is critical to reduce stiction chances while effectively maintaining the mechanical stability of the insulation layer. The stiction is well-known problem and reliability issue for contact based microelectromechanical drives 1, especially in case of the drives using electrostatic clamping. Since the insulation layer can be structured in a non-continuous manner, it reduces the chances of stiction. On one hand the structured insulation layer reduces the stiction surface and on the other hand the structured insulation layer of the cantilever 2 which is made e.g., of Si, allows for a high mechanical stability and resilience improving the reliability of the contact area of the electrostatic bending actuator 10. Above that, electrostatic bending actuators of microelectromechanical drives 1, e.g., inchworm drives have the possibility of incorporating anti-stiction coatings to further reduce chances of stiction if applicable.

According to another embodiment, mechanical force can be used in order to clamp the contact area 7 of the loose end 6 of the cantilever 2 of the electrostatic bending actuator 10 to the surface 27 of the target object 20. In this case, the electrostatic bending actuator 10 is clamped on the surface 27 of the target object 20 by employing the stroke and the mechanical force generated by active springs 9.

Figure 4A:
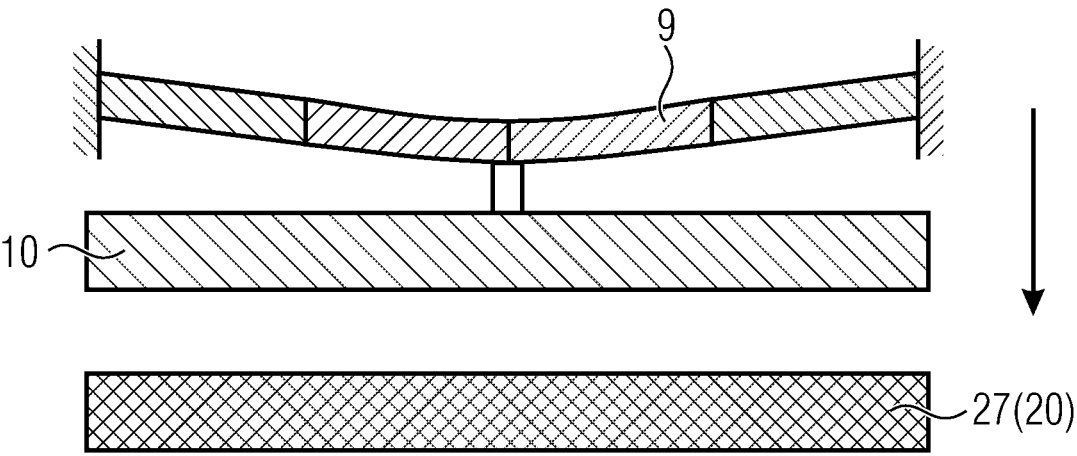
FIG. 4a shows a schematic diagram of a use of an active spring according to an embodiment.
Figure 4B:
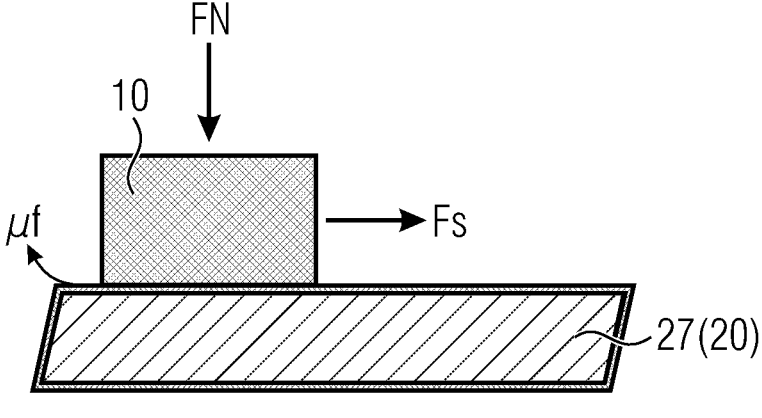
FIG. 4b shows a schematic diagram forces involved during a movement of a target object according to an embodiment.

According to an embodiment, FIG. 4(*a*) shows the active spring 9 can employ NED-beams as active element case, but could also be implemented by other actuation schemes such as electrostatic actuation, piezoelectric actuation, thermal actuation, etc. The number of NED-beams used in the active spring 9 depends on the used clamping force FN. In addition, each active spring 9 could be connected to several active elements. As shown in FIG. 4(*b*), the clamping force FN should at least be high enough to prevent sliding—indicated by the adhesive friction coefficient µf—of the electrostatic bending actuator 10 on the clamping surface 27 due to the force FN, FBL generated by the electrostatic bending actuator 10 of the microelectromechanical drive 1. This consequently depends on the force, e.g., stroke forces FBL generated by the microelectromechanical drive 1, i.e., electrostatic bending actuator 10 clamped on the surface 27 as well as the friction coefficient µf.

According to another embodiment, mechanical and electrical forces can be combined in order to clamp the contact area 7 of the loose end 6 of the cantilever 2 of the electrostatic bending actuator 10 to the surface 27 of the target object 20. In this case, electrostatic clamping due to a voltage V is accompanied by the force FN of active springs for the mechanical clamping. An advantage of this approach is that a spacing between the contact area 7 of the electrostatic bending actuator 10 and the surface 27 of the target object 20 can be overcome. To understand the advantage of this approach, one should note that the electrostatic force drops by a square of a distance between the two surfaces 7, 27. On the other hand, due to fabrication or system assembly errors that may occur at the time of the integration of the microelectromechanical drive 1, e.g., inchworm drive in an equipment or appliance, the distance could become too large for electrostatic force to become fully effective for the designed voltage V. By using active springs 9, the error can be counteracted, making the microelectromechanical drive 1 more resilient to alignment errors.

To allow movement of an electrostatic bending actuator 10 of the microelectromechanical drive 1 to clamp on the surface 27 of the target object 20 by using electrostatic or mechanical force, a spring 9 is used. Based on the intended application, the spring 9 can be in any suitable form such as fixed-fixed flexure, serpentine springs, etc. The springs are categorized as being passive or active. In case of passive springs 9, they do not generate any movement by themselves and use passive elements. On the other hand, an active spring 9 can generate a force and movement along the direction of clamping, for example, by using NED-beams as active elements. The former is used in electrostatic clamping and the latter is used in mechanical clamping. In case of a combination of clamping forces FN and V, an active spring 9 is used. Furthermore, several electrostatic bending actuators 10 of the microelectromechanical drive 1 can share one spring 9 according to the intended application and condition, e.g., in a comb-configuration of a multitude of electrostatic bending actuators arranged parallel to one another.

To move the target object 20, one can either rely on an active force generated by electrostatic force FBL in an electrostatic bending actuator (10) when deflecting d, or on the restoring force-FBL, which opposes the active force after turning off the actuation force in the electrostatic bending actuator (10). In both cases, the amplitude of the force FBL is the same and the direction is different. This is shown in the Force-Displacement-Graph in FIG. 5 for a standard NED based electrostatic bending actuator (10), where d denotes the deflection/movement of the loose end of. Since the microelectromechanical drive 1, e.g., inchworm drive presented here can have more than one electrostatic bending actuator (10), each element or group of elements may be controlled individually, and a combination of the active and restoring forces may be used. In other words, some electrostatic bending actuators (10) can be in active force mode while some other elements may be in restoring force mode. The restoring force of the electrostatic bending actuator (10) can be exploited to accelerate or deaccelerate the target object during and/or after each movement step. The deceleration can be used to stabilize the system. For example, after the target object has gained a certain speed or momentum, the actuation force in the electrostatic bending actuators (10) can be turned off in order to use the corresponding restoring force to stop the moving target object 20.

As depicted in FIG. 6, the electrostatic bending actuators (10) can be arranged linearly (a) to achieve a linear motion, or be arranged in circular pattern to achieve a rotating movement (b) depending on the target body. A combination of linear arrangements, circular arrangements, or both, can also be used to create single or multidirectional movements such as 2D motions, 3D motions, angular motions, rotatory motions, etc. Examples of few such possible cases are shown in FIG. 6. According to an embodiment, the electrostatic bending actuators (10) may be placed around a circular wheel in a more efficient and effective manner, achieving higher force and also allowing more precise control over a rotating body.

Figures 7A, 7B:
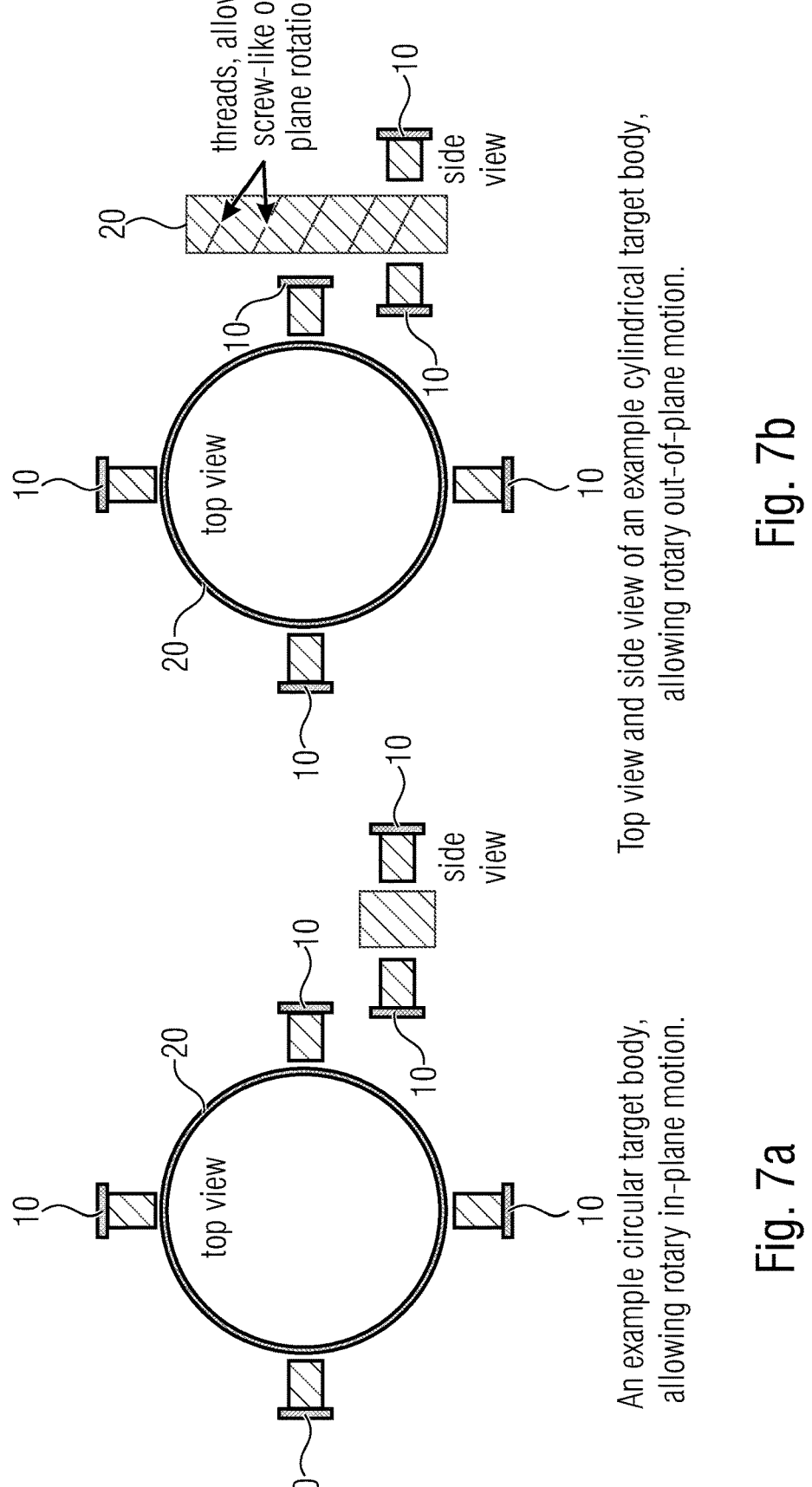
FIG. 7a-7c shows different arrangements of a microelectromechanical drive in relation to an object to be moved, according to embodiments.
Figure 7C:
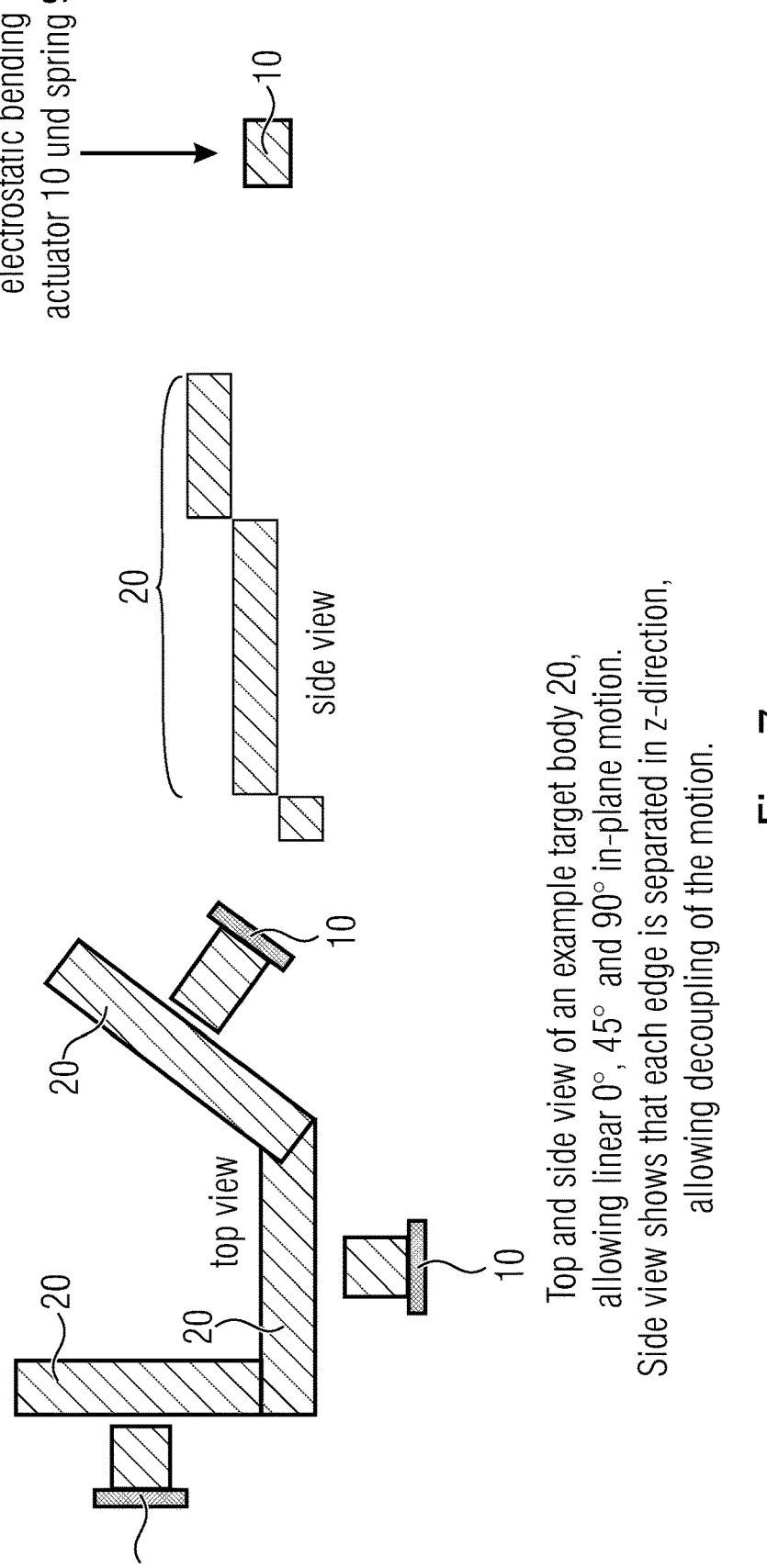

Alternatively, the target body path of motion can be designed to allow only a linear, rotational, or desired multidirectional movements. Examples of few such cases are shown in FIG. 7(*a, b, c*). FIG. 7(*a*) shows in an embodiment a circular target body with arrangement of electrostatic bending actuators (10) by 90 degree distance allowing a circular in-plane motion. FIG. 7(*b*) depicts a circular target body similar to FIG. 7(*a*), but with threads on the cylindrical surface, to allow out-of-plane rotary screw-like movement. It is worth noting that an out-of-plane non-rotary motion would also be possible to achieve, in which case the threads on the target body are not required. FIG. 7(*c*) represent a target body allowing linear 0°, 45° and 90° in-plane motion in-plane movement. An embodiment of electrostatic bending actuators (10) arrangement is also shown.

The electrostatic bending actuators (10) can also be designed to deflect in-plane, out-of-plane or both, thus allowing single or multidirectional motions based directly upon the electrostatic bending actuator (10) deflection motion, rather than just their arrangement or target body motion path arrangement. A combination of all the three is always possible.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] H. Conrad, H, Schenk, C. Schirrmann, T. Sandner, F. ZIMMMER, J. U. Schmidt, Micromechanical component: WO 2012/095185 A1.

[2] Y. Gao, J. Wen, J. Ma, Y. Zhang, R. Wang, Y. Hu, J. Li, A self-adapting linear inchworm piezoelectric actuator based on a permanent magnets clamping structure, Mechanical Systems and Signal Processing 132 (2019) 429-440. https://doi.org/10.1016/j.ymssp.2019.06.032.

[3] W. Wang, S. Tatic-Lucic, W. Brown, J. Iceman, S. Hyun, R. Vinci, Precision in-package positioning with a thermal inchworm, Sensors and Actuators A: Physical 142 (2008) 316-321. https://doi.org/10.1016/j.sna.2007.04.049.

[4] I. Penskiy, S. Bergbreiter, Optimized electrostatic inchworm motors using a flexible driving arm, J. Micromech. Microeng. 23 (2013) 15018. https://doi.org/10.1088/0960-1317/23/1/015018.

[5] H. W. Zhou, B. G. Kharas, P. I. Gouma, Microstructure of thick polycrystalline silicon films for MEMS application, Sensors and Actuators A: Physical 104 (2003) 1-5. https://doi.org/10.1016/S0924-4247(02)00433-8.

[6] I. P. M. Wickramasinghe, J. M. Berg, Lateral stability of a periodically forced electrostatic comb drive, in: 2012 American Control Conference (ACC), IEEE, 27.06.2012-29.06.2012, pp. 80-85.

The invention claimed is:

1. A microelectromechanical drive for moving an object, comprising electrostatic bending actuators, wherein each electrostatic bending actuator comprises a cantilever comprising at least one active element which comprises a layer stack forming at least one capacitor positioned offset to a center-of-gravity-plane of the cantilever which leads alongside a longitudinal axis of the cantilever from a supported end of the cantilever to a loose end, which is averted from the supported end of the cantilever and which comprises a contact area for engaging with the object, wherein each electrostatic bending actuator comprises a cantilever comprising:

at least one first active element which comprises a first layer stack forming a first capacitor positioned offset to a center-of-gravity-plane of the cantilever, which leads alongside a longitudinal axis of the cantilever from a supported end of the cantilever to the loose end of the cantilever, which comprises a contact area for engaging with the object, and a second capacitor positioned offset to the center-of-gravity-plane so that the center-of-gravity-plane is arranged between the first and second capacitors, and at least one second active element which comprises a second layer stack forming a third capacitor positioned offset to the center-of-gravity-plane and a fourth capacitor positioned offset to the center-of-gravity-plane so that the center-of-gravity-plane is arranged between the first and third capacitor on the one hand and the second and fourth capacitors on the other hand, wherein the at least one first and the at least one second active element are mutually offset along the longitudinal axis of the cantilever, and wherein the at least one first and the at least one second element are actuatable to bend with opposing curvatures so that the cantilever bends towards opposite sides of the center-of-gravity-plane within the at least one first element on the one hand and the at least one second element on the other hand;

wherein the supported end of the cantilever is held in a guided bearing which allows for displacement in direction of a longitudinal axis of the cantilever.

2. The microelectromechanical drive according to claim 1, wherein the layer stack forms a first capacitor positioned offset to the center-of-gravity-plane of the cantilever, and a second capacitor positioned offset to the center-of-gravity-plane so that the center-of-gravity-plane is arranged between the first and second capacitors.

3. The microelectromechanical drive according to claim 1, wherein all active elements of the cantilever are bendable in a common plane.

4. The microelectromechanical drive according to claim 1, wherein the electrostatic bending actuators are grouped into at least two electrostatic bending actuators and the Microelectromechanical drive is configured so that the electrostatic bending actuators within one group are actuated so as to perform a simultaneous back and forth bending, and/or electrostatic bending actuators of different groups are actuated in a phase offset manner.

5. The microelectromechanical drive according to claim 1, wherein the cantilevers of all electrostatic bending actuators are configured to bend in a common plane.

6. The microelectromechanical drive according to claim 1, wherein the cantilevers of all electrostatic bending actuators are arranged parallel to each other so that the contact areas of the cantilevers are arranged so as to form a transport surface of the object.

7. The microelectromechanical drive according to claim 1, wherein a longitudinal extension of two adjacent active elements is equal.

8. The microelectromechanical drive according to claim 1, wherein the microelectromechanical drive is an inchworm drive.

9. The microelectromechanical drive according to claim 1, wherein the cantilever of the electrostatic bending actuators comprises a length between 2 micrometers to 280 millimeters, advantageously a length between 10 micrometers to 10 millimeters or even more advantageously a length of 600 micrometers.

10. The microelectromechanical drive according to claim 1, wherein the cantilever of the electrostatic bending actuators can be moved in a frequency range between 5 kHz up to 100 MHz, more advantageously in a frequency around 10 KHz.

11. The microelectromechanical drive according to claim 1, wherein the electrostatic bending actuator is made of one or more metal-polymer materials and/or CMOS-compatible materials, advantageously materials selected from crystalline-Si, TiAl, SiO2, Al2O3.

12. The microelectromechanical drive according to claim 1, wherein the supported end of the cantilever is held in a fixed mount/clamped bearing.

13. The microelectromechanical drive according to claim 1, wherein the supported end of the cantilever is attached to a spring.

14. The microelectromechanical drive according to claim 13, wherein the spring is configured to actively and/or passively exert a restoring force upon stress.

15. The microelectromechanical drive according to claim 13, wherein the spring is configured to actively and/or passively exert a clamping force by pressing the contact area of the cantilever against the target object.

16. The microelectromechanical drive according to claim 13, wherein at least two electrostatic bending actuators share the same spring.

17. The microelectromechanical drive according to claim 1, wherein the contact area comprises an insulation layer.

18. The microelectromechanical drive according to claim 17, wherein the insulation layer is structured in the contact area at the loose end of the cantilever.

19. The microelectromechanical drive according to claim 1, wherein the contact area comprises an anti-stiction coating.

20. The microelectromechanical drive according to claim 1, wherein a material of the contact area is made of one or more metal-polymer materials and/or CMOS-compatible materials advantageously materials selected from crystalline-Si, Al2O3, SiO2, HfO2.

21. The microelectromechanical drive according to claim 1, wherein the contact area comprises a predefined structure.

22. The microelectromechanical drive according to claim 1, wherein the contact areas of each of the cantilevers of the electrostatic bending actuators define a curved surface.

23. The microelectromechanical drive according to claim 1, wherein the microelectromechanical drive is configured to move target objects of solid matter.

* * * * *